(12) United States Patent
Liang et al.

(10) Patent No.: US 12,214,580 B2
(45) Date of Patent: Feb. 4, 2025

(54) METHOD FOR TRANSFERRING A LAYER TO A SUBSTRATE

(71) Applicants: IMEC VZW, Leuven (BE); Katholieke Universiteit Leuven, KU LEUVEN R&D, Leuven (BE)

(72) Inventors: Boshen Liang, Herent (BE); Dominika Wysocka, Leuven (BE); David Cheyns, Heffen (BE)

(73) Assignees: IMEC VZW, Leuven (BE); Katholieke Universiteit Leuven, KU LEUVEN R&D, Leuven (BE)

( * ) Notice: Subject to any disclaimer, the term of this patent is extended or adjusted under 35 U.S.C. 154(b) by 0 days.

(21) Appl. No.: 17/834,413

(22) Filed: Jun. 7, 2022

(65) Prior Publication Data

US 2022/0396067 A1 Dec. 15, 2022

(30) Foreign Application Priority Data

Jun. 9, 2021 (EP) ..................................... 21178581

(51) Int. Cl.
*B32B 43/00* (2006.01)
*B32B 37/24* (2006.01)
*B81C 1/00* (2006.01)

(52) U.S. Cl.
CPC ............ *B32B 43/006* (2013.01); *B32B 37/24* (2013.01); *B81C 1/00238* (2013.01); *B32B 2037/243* (2013.01); *B81C 2203/0785* (2013.01)

(58) Field of Classification Search
CPC . B32B 43/006; B32B 37/24; B32B 2037/243; B81C 1/00238; B81C 2203/0785; H01L 21/02002
See application file for complete search history.

(56) References Cited

U.S. PATENT DOCUMENTS

| 6,700,631 B1* | 3/2004 | Inoue | ................. | H01L 27/1266 |
| | | | | 257/E27.111 |
| 2009/0261062 A1 | 10/2009 | Kim | | |

(Continued)

FOREIGN PATENT DOCUMENTS

WO 2021095480 A1 5/2021

OTHER PUBLICATIONS

D. Armani, C. Liu and N. Aluru, "Re-configurable fluid circuits by PDMS elastomer micromachining," Technical Digest. IEEE International MEMS 99 Conference. Twelfth IEEE International Conference on Micro Electro Mechanical Systems, Jan. 1999 (Year: 1999).*

(Continued)

*Primary Examiner* — Alex B Efta
*Assistant Examiner* — Alexander S Wright
(74) *Attorney, Agent, or Firm* — McDonnell Boehnen Hulbert & Berghoff LLP

(57) ABSTRACT

The present disclosure relates to a method for transferring a target layer to a substrate. The method includes providing a stack by forming a first transfer layer over a first substrate, forming a second transfer layer on the first transfer layer, the second transfer layer being water-soluble, and forming the target layer on the second transfer layer, such that the stack has a top surface. The method also includes bonding the top surface of the stack to a second substrate, separating the first transfer layer from the second transfer layer, and dissolving the second transfer layer in water.

20 Claims, 5 Drawing Sheets

(56) References Cited

U.S. PATENT DOCUMENTS

| | | | |
|---|---|---|---|
| 2017/0170003 A1 | 6/2017 | Hichri | |
| 2017/0320057 A1* | 11/2017 | Hofmeister | B01D 69/12 |
| 2021/0154660 A1* | 5/2021 | Bauert | H01L 21/02002 |

OTHER PUBLICATIONS

Extended European Search Report and Written Opinion, Application No. EP21178581.1, mailed Dec. 1, 2021, 7 pages.

Ji, Bowen, Zhaoqian Xie, Wen Hong, Chunpeng Jiang, Zhejun Guo, Longchun Wang, Xiaolin Wang, Bin Yang, and Jingquan Liu. "Stretchable Parylene-C electrodes enabled by serpentine structures on arbitrary elastomers by silicone rubber adhesive." Journal of Materiomics 6, No. 2 (2020): 330-338.

Nam, Jiyoon, Youngjoo Lee, Wonjung Choi, Chang Su Kim, Hogyoung Kim, Jongbok Kim, Dong-Ho Kim, and Sungjin Jo. "Transfer Printed Flexible and Stretchable Thin Film Solar Cells Using a Water-Soluble Sacrificial Layer." Advanced Energy Materials 6, No. 21 (2016): 1601269.

\* cited by examiner

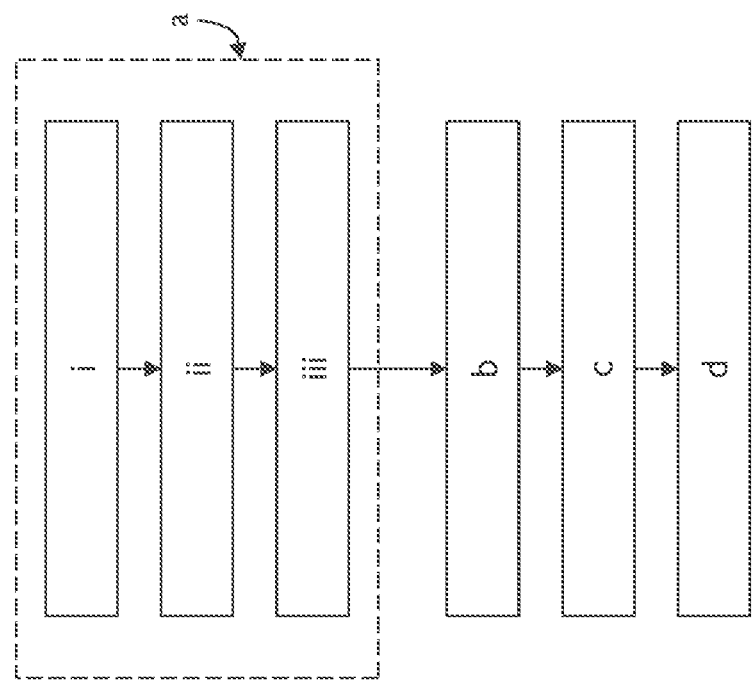

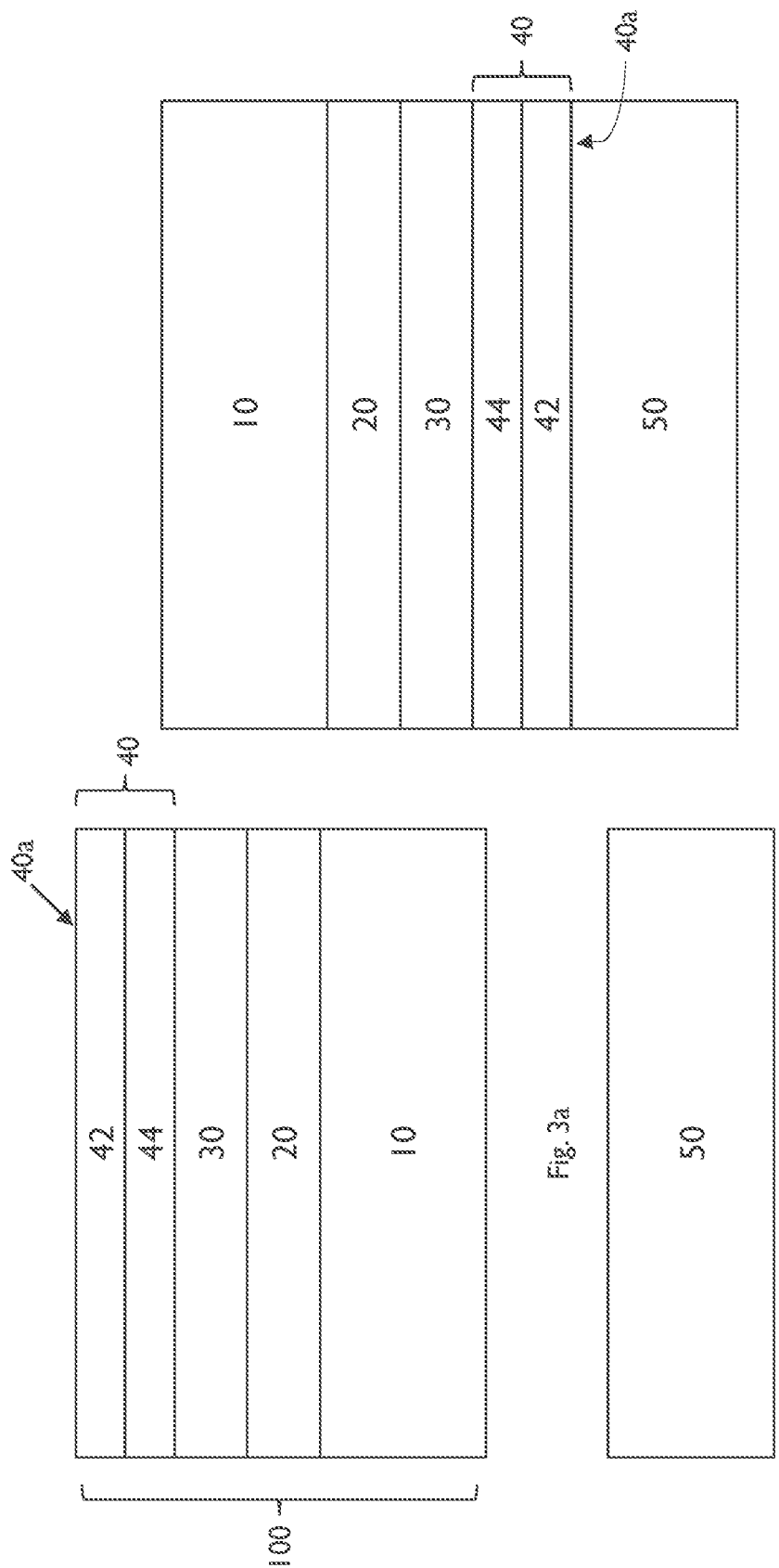

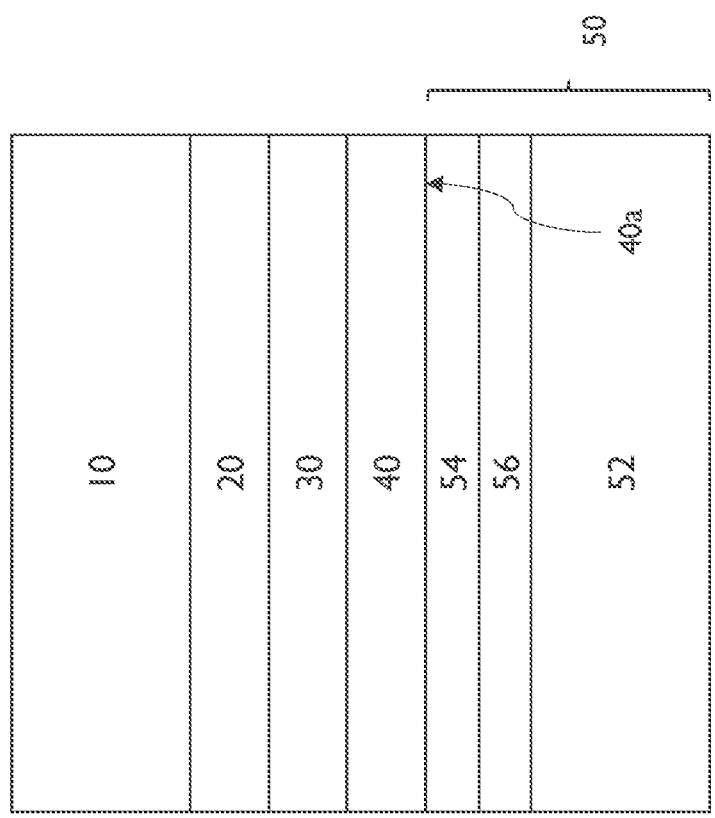
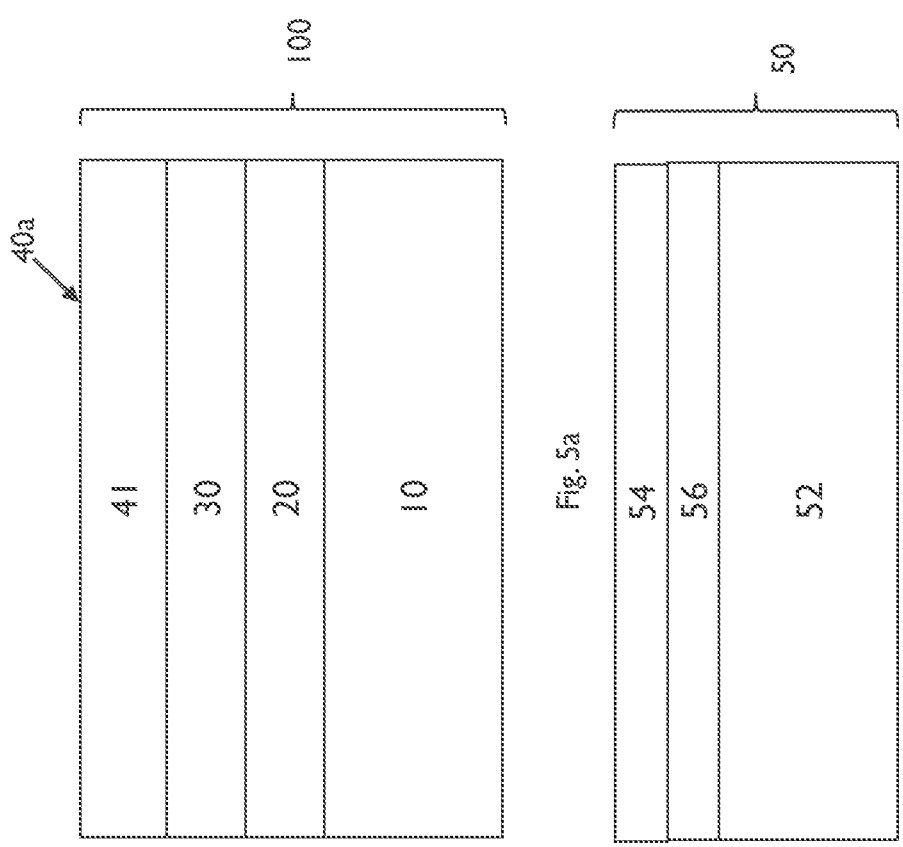

METHOD FOR TRANSFERRING A LAYER TO A SUBSTRATE

CROSS-REFERENCE TO RELATED APPLICATIONS

The present application is a non-provisional patent application claiming priority to European Patent Application No. 21178581.1, filed Jun. 9, 2021, the contents of which are hereby incorporated by reference.

FIELD OF THE DISCLOSURE

The present disclosure is generally related to a method of transferring a layer to a substrate when manufacturing integrated circuits and more specifically to a method of transferring a fragile layer to a substrate.

BACKGROUND in recent years, there has been an increasing interest in introducing novel materials and/or thin well-developed material to boost device performances in IC (integrated circuit) and non-IC industries. These materials range from inorganic layers such as III-V materials, dielectrics, and quantum dots to organics layers such as soft polymers, organic semiconductors, living cells and so on. With conventional transfer methods, fragile layers of those materials cannot be deposited directly on a substrate due to the weak physical constraints of the materials (chemical, mechanical, optical and/or thermal), or due to process-introduced physical constraints, including for example chemical, mechanical, optical and/or thermal constraints.

A known technique for transferring a patterned metal layer to a substrate by using PVA tape is disclosed in document "*Stretchable Parylene-C electrodes enabled by serpentine structures on arbitrary elastomers by silicone rubber adhesive*", by Bowen Ji et al, Journal of Materiomics 6 (2020) 330-338. The PVA tape must be dissolved in hot water with the help of foam tip swabs. A further step of immersing in acetone is required to remove the residual photoresist mask. These steps are not compatible when the layer to be transferred has a weak chemical/thermal nature. Besides, this technique is not applicable for transferring a large area layer, such as 200 mm, 300 mm or 450 mm wafer size.

Another known technique for transferring flexible and stretchable thin film solar cells to a substrate is disclosed in document "*Transfer Printed Flexible and Stretchable Thin Film Solar Cells Using a Water-Soluble Sacrificial Layer*", by Jiyoon Nam et al. Adv. Energy Mater. 2016, 1601269. This technique is not efficient for transferring a large area layer, such as 200 mm, 300 mm or 450 mm wafer size because of the limited exposure area to water from the edge of the structure during process.

There is a need to improve the current state of the art methods of transferring a target layer to a substrate.

SUMMARY

The disclosure includes a method for transferring a fragile target layer to a substrate.

According to a first aspect of the disclosure, there is provided a method for transferring a layer to a substrate comprising:
a. providing a stack by:
 i. forming a first transfer layer over a first substrate
 ii. forming a second transfer layer on the first transfer layer, the second transfer layer being water-soluble
 iii. forming the target layer on the second transfer layer, wherein the stack has a top surface
b. bonding the top surface of the stack to a second substrate
c. separating the first transfer layer from the second transfer layer and
d. dissolving the second transfer layer in water.

The step c separates the target layer from the first substrate. The second transfer layer in this step provides a protection for the target layer during the separation. It also exposes one side of the second transfer layer so that in step d, the second transfer layer is removed regardless of the dimension of target layer. Additionally, the method can allow process steps on the second substrate with, for example, high temperature budget, broad range of etchant, etc. before the target layer is transferred.

According to an example embodiment, the second transfer layer may be dissolved in water at room temperature, 300 K. This can allow transfer of very temperature-sensitive materials/layers, such as living cells.

According to an example embodiment, the target layer comprises an elastomer layer. Transferring an elastomer layer, for example a thin elastomer layer, can form structures such as pneumatic valves for microfluidic devices.

According to an example embodiment, the elastomer layer has a Young's modulus equal to or less than 500 MPa at room temperature. The room temperature is 300K.

According to an example embodiment, wherein the target layer further comprises a conductive layer. According to an example embodiment, the conductive layer is patterned in step after deposition. According to an example embodiment, the conductive layer has a direct contact on the second transfer layer. It can be patterned after step d. The conductive layer provides the possibility of having electronic circuits in the final device. In the application of microfluidic devices, the electronic circuits can be used for controlling, for example, a fluid.

According to an example embodiment, the conductive layer is formed before the elastomer layer. As an example in the application of microfluidic devices, the electronic circuits can be used for controlling, for example, a pneumatic valve.

According to an example embodiment, the conductive layer is a thin film metal layer or an inorganic layer.

According to an example embodiment, the second substrate comprises a glass supporting substrate. The glass supporting substrate is compatible for microfluidic devices.

According to an example embodiment, the second substrate further comprises a patterned elastomer layer comprising a channel configured for microfluidic flow.

According to an example embodiment, the second substrate comprises a thin-film layer configured for comprising electronic circuitry. The electronic circuitry embedded in the second substrate allows controlling of a microfluidic device.

According to an example embodiment, the first substrate is transparent, and the first transfer layer is an optical sensitive layer, and the second transfer layer is separated from the first transfer layer by exposing to a laser source in step c.

According to an example embodiment, the method is compatible with CMOS technology.

BRIEF DESCRIPTION OF THE FIGURES

The above, as well as additional, features will be better understood through the following illustrative and non-limiting detailed description of example embodiments, with reference to the appended drawings.

FIG. 1 is a flow chart of a method for transferring a target layer to a target substrate, according to an example.

FIG. 3a is a cross section schematic illustration of a stack, a target substrate, and the bonding step of the stack to the target substrate, according to an example.

FIG. 3b is a cross section schematic illustration of a stack, a target substrate, and the bonding step of the stack to the target substrate, according to an example.

FIG. 3c is a cross section schematic illustration of a stack, a target substrate, and the bonding step of the stack to the target substrate, according to an example.

FIG. 5a is a cross section schematic illustration of a stack, a target substrate, and the bonding step of the stack to the target substrate, according to an example.

FIG. 5b is a cross section schematic illustration of a stack, a target substrate, and the bonding step of the stack to the target substrate, according to an example.

FIG. 5c is a cross section schematic illustration of a stack, a target substrate, and the bonding step of the stack to the target substrate, according to an example.

Figure 2A:
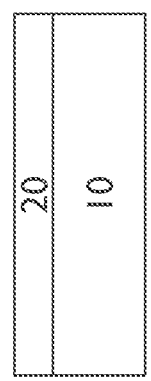
FIG. 2a is a schematic illustration of a cross section of a plurality of stacks resulting from the steps of the process flowchart of FIG. 1, according to an example.

All the figures are schematic, not necessarily to scale, and generally only show parts which are necessary to elucidate example embodiments, wherein other parts may be omitted or merely suggested.

DETAILED DESCRIPTION

Example embodiments will now be described more fully hereinafter with reference to the accompanying drawings. That which is encompassed by the claims may, however, be embodied in many different forms and should not be construed as limited to the embodiments set forth herein; rather, these embodiments are provided by way of example. Furthermore, like numbers refer to the same or similar elements or components throughout.

The disclosure will be further elucidated by means of the following description and the appended figures. Various exemplary embodiments are described herein with reference to the following figures, wherein like numeral denotes like entities. The figures described are schematic and are non-limiting. Further, any reference signs in the claims shall not be construed as limiting the scope of the present disclosure. Still further, in the different figures, the same reference signs refer to the same or analogous elements.

The terms "over" and "above" are used for position indication of layers and not necessarily for describing a direct contact of the layers. It is to be understood that the terms so used are interchangeable under appropriate circumstances. The term "on" is used for position indication of layers and describing a direct contact of the layers.

The term "top surface" is used as a reference for a certain surface. It is to be understood that the "top surface" can be a bottom surface in figures under appropriate circumstances, for example when the surface/stack is turned around.

The term "room temperature" refers to 300 K (Kelvin).

FIG. 1 shows a process flowchart of transferring a target layer to a target substrate, comprising the steps of:

In step a, a stack 100 is formed by:
forming a first transfer layer 20 over a first substrate 10,
forming a second transfer layer 30 over the first transfer layer 20, the second transfer layer 30 being water-soluble,
forming the target layer 40 on the second transfer layer 30, wherein the stack 100 has a top surface 40a.

In step b, the top surface 40a of the stack 100 is bonded to a second substrate 50.

In step c, the first transfer layer 20 is separated from the second transfer layer 30.

In step d, the second transfer layer 30 is dissolved in water.

The steps in FIG. 1 are further illustrated with the help of FIGS. 2a to 5c. In FIG. 2a, the first transfer layer 20 is deposited above the first substrate 10. According to an example embodiment, the first transfer layer 20 is a polymer layer formed on the first substrate 10, for example, by spin coating.

Figure 2B:
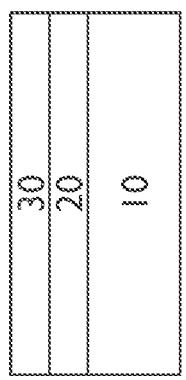
FIG. 2b is a schematic illustration of a cross section of a plurality of stacks resulting from the steps of the process flowchart of FIG. 1, according to an example.

In FIG. 2b, the water soluble second transfer layer 30 is deposited on the first transfer layer 20, which has been formed on the first substrate 10. According to an example embodiment, the second transfer layer 30 is dissolvable in water at room temperature. According to an example embodiment, the second transfer layer 30 is a polymer layer dissolvable in water at room temperature, for example, but not limited to, a Polyvinyl alcohol) (PVOH, PVA, or PVAl) layer. According to an example embodiment, the second transfer layer 30 has a thickness of less than 10 μm, for example 0.8 μm.

Figure 2C:
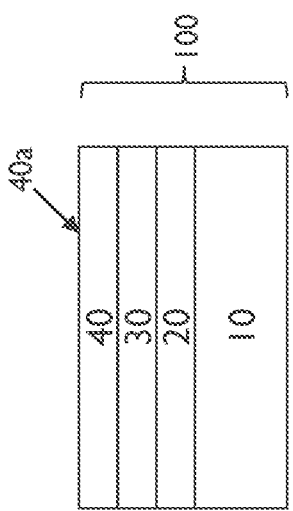
FIG. 2c is a schematic illustration of a cross section of a plurality of stacks resulting from the steps of the process flowchart of FIG. 1, according to an example.
Figure 2D:
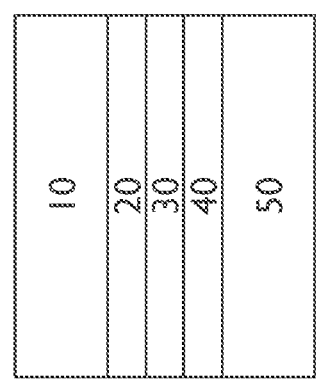
FIG. 2d is a schematic illustration of a cross section of a plurality of stacks resulting from the steps of the process flowchart of FIG. 1, according to an example.

In FIG. 2c, the target layer 40 is deposited above the water soluble second transfer layer 30, having a top surface 40a. According to an example embodiment, the target layer 40 is a chemically and/or physically weak layer. The target layer may comprise materials that range from inorganic layers such as materials, dielectrics, quantum dots to organic layers such as soft polymers, organic semiconductors, living cells and so on. Fragile layers of those materials can be transferred regardless of the weak physical constraints of the materials (chemical, mechanical, optical and/or thermal) and/or process-introduced physical constraints, including for example chemical, mechanical, optical and/or thermal constraints. According to an example embodiment, the target layer comprises an elastomer layer 42. The elastomer layer 42 may have a Young's modulus equal or less than 500 Mpa at room temperature 300 K, for example equal to or less than 100 MPa at room temperature. According to an example embodiment, the elastomer layer 42 is formed by spin coating. According to an example embodiment, the thickness of the elastomer layer 42 is equal to or less than 100 μm, for example equal to or less than 15 μm.

According to an example embodiment, the target layer 40 comprises an elastomer layer 42 and a conductive layer 44. According to an example embodiment, as shown in FIG. 3a, the conductive layer 44 is deposited before the elastomer layer 42. According to another example embodiment, the conductive layer 44 is deposited after the elastomer layer 42, which is not shown in the figures. According to another example embodiment, which is not shown in the figures, the target layer 40 comprises multiple layers such as a plurality of elastomer layers, a plurality of conductive layers and/or a combination. According to an example embodiment, the conductive layer 44 comprises a thin film metal layer. The metal layer may be a layer of metal, for example aluminum (Al), copper (Cu), iron (Fe) or an alloy thereof. According to an example embodiment, the conductive layer 44 comprises an inorganic layer. The inorganic layer may comprise silicon (Si), a III-V material, a 2-dimensional material and/or another conductive non-metallic material. According to an example embodiment, the conductive layer 44 has a thickness of equal to or less than 100 nm.

According to an example embodiment, the conductive layer 44 is a thin film metal layer, an inorganic layer, or a combination thereof. According to an example, the conductive layer 44 is formed by for example chemical vapor deposition (CVD), physical vapor deposition (PVD), atomic layer deposition (ALD), etc.

According to an example embodiment, which is not shown in the figures, the method may further comprise a step of patterning of at least one layer, the conductive layer and/or the elastomer layer, of the target layer 40 before step b to form electronic connections/circuits.

In FIGS. 2d, 3c, 4c and 5c, the top surface 40a of the stack 100 is bonded to the second substrate 50.

Figure 4C:
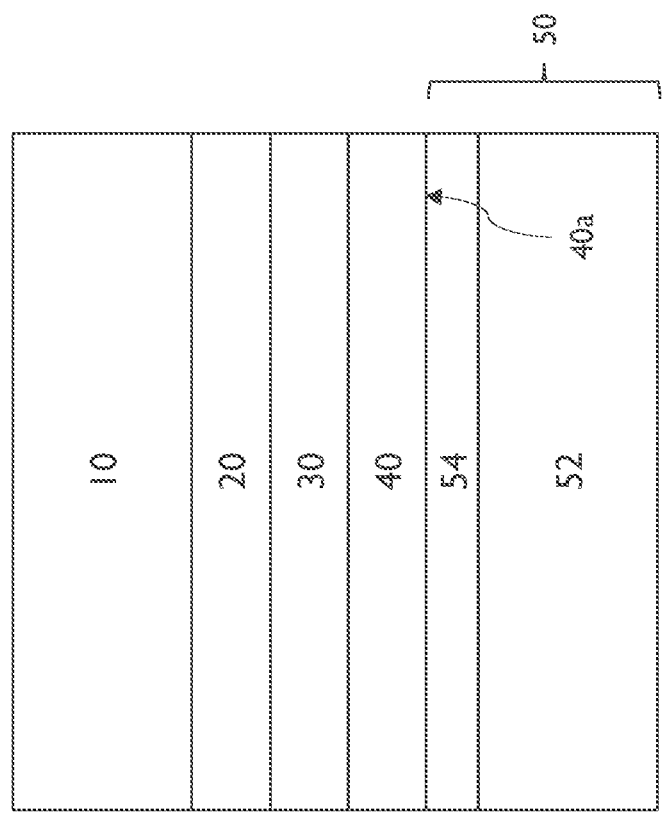
FIG. 4c is a cross section schematic illustration of a stack, a target substrate, and the bonding step of the stack to the target substrate, according to an example.
Figure 4A:
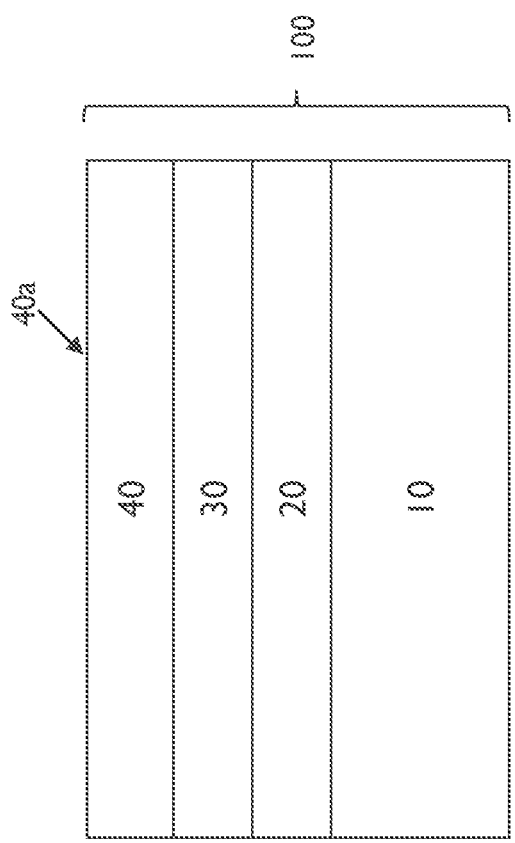
FIG. 4a is a cross section schematic illustration of a stack, a target substrate, and the bonding step of the stack to the target substrate, according to an example.
Figure 4B:
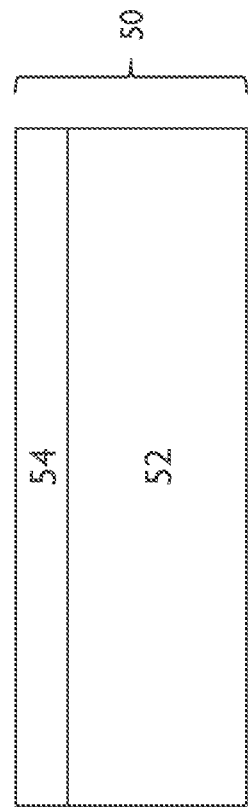
FIG. 4b is a cross section schematic illustration of a stack, a target substrate, and the bonding step of the stack to the target substrate, according to an example.

According to an example embodiment the second substrate 50 comprises a semiconductor substrate, such as silicon, GaN, or another semiconductor material. The second substrate 50 may also comprise a glass supporting substrate 52 which can be used in microfluidic devices for possible optical inspection. According to an example embodiment, the second substrate 50 may comprise an elastomer layer 54 formed by spin coating. According to an example embodiment, as shown in FIG. 4b, the second substrate comprises an elastomer layer 54 above a supporting substrate 52. The elastomer layer 54 may be patterned before step b in FIG. 1, According to an example embodiment, the elastomer layer 54 may be of the same type as the elastomer layer 42. According to an example embodiment, the elastomer layer 54 is patterned to form at least a channel configured for microfluidic flow. According to an example embodiment, the second substrate 50 may comprise a semiconductor circuit layer. In an embodiment, as shown in FIG. 5b, the semiconductor circuit layer is a thin-film layer 56 configured as an electronic circuit by patterning processes. According to an example embodiment, the patterning uses lithography technology. According to an example embodiment, the elastomer layer 54 is formed above the thin-film layer 56.

Figure 2E:
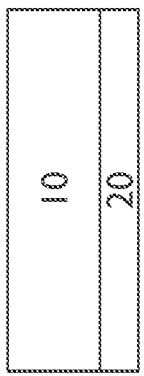
FIG. 2e is a schematic illustration of a cross section of a plurality of stacks resulting from the steps of the process flowchart of FIG. 1, according to an example.

In FIG. 2e, the first transfer layer 20 is separated from the second transfer layer 30. The separation may be done by a thermal process. According to an example embodiment, the first transfer layer 20 can be a thermal sensitive layer where the chemical properties of the first transfer layer 20 is changed when exposed to a heat source. The separation may be alternatively done by exposure to a laser source. According to another example embodiment, the first transfer layer 20 is an optical sensitive layer where the chemical properties of the first transfer layer 20 is changed when exposed to a laser source of certain wavelength. The first substrate 10 is transparent so that, the first transfer layer 20 can be separated from the second transfer layer 30 by exposure to the laser source. Being transparent means that the laser with a certain wavelength, for example 248 nm, can be transmitted through the first substrate 10. When the separation is in progress, the second transfer layer 30 functions as a protective layer to protect the fragile target layer 40.

Figure 2F:
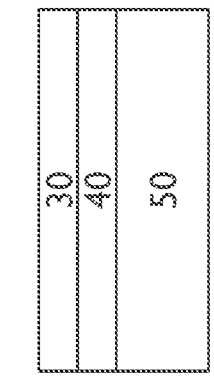
FIG. 2f is a schematic illustration of a cross section of a plurality of stacks resulting from the steps of the process flowchart of FIG. 1, according to an example.
Figure 2F:
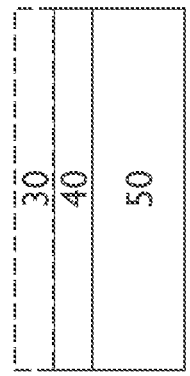

In FIG. 2f, the second transfer layer 30 is dissolved in water. The process is for example done at room temperature to further limit damage or impact on the transfer layer 30. According to an example, one side of the second transfer layer 30 is completely exposed to water. According to an example, because of the large exposure area of the second transfer layer 30, step c ire FIG. 1 takes less than 1 minute to remove the second transfer layer 30 with a thickness of 0.8 μm in the case of transferring the target layer 40 to the second substrate.

Figure 2G:
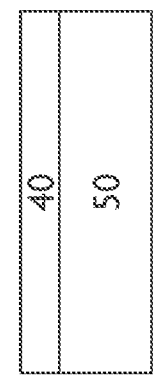
FIG. 2g is a schematic illustration of a cross section of a plurality of stacks resulting from the steps of the process flowchart of FIG. 1, according to an example.

In FIG. 2g, the fragile target layer 40 is efficiently and successfully transferred to the second substrate 50.

According to an example embodiment, the transferring method is applicable for die to die, wafer to wafer or roll to roll transfer due to the large exposure area of the second transfer layer 30 to water.

According to an example embodiment, which is not shown in the figures, the method further comprises a step of patterning of at least one layer in the target layer 40 after step d in FIG. 1 to form for example electronic connections/circuits.

According to an example embodiment, the process of lithography, bonding, debonding and patterning are conventional CMOS (Complementary metal-oxide-semiconductor) technology processes.

While some embodiments have been illustrated and described in detail in the appended drawings and the foregoing description, such illustration and description are to be considered illustrative and not restrictive. Other variations to the disclosed embodiments can be understood and effected in practicing the claims, from a study of the drawings, the disclosure, and the appended claims. The mere fact that certain measures or features are recited in mutually different dependent claims does not indicate that a combination of these measures or features cannot be used. Any reference signs in the claims should not be construed as limiting the scope.

What is claimed is:
1. A method comprising:
  providing a stack by:
    forming a first transfer layer over a first substrate;
    forming a second transfer layer on the first transfer layer, the second transfer layer being water-soluble; and
    forming a target layer in contact with the second transfer layer such that the target layer forms a top surface of the stack;
  bonding the top surface of the stack to a second substrate;
  separating the first transfer layer from the second transfer layer; and
  removing the second transfer layer from the target layer such that the target layer remains on the second substrate.

2. The method of claim 1, wherein removing the second transfer layer comprises dissolving the second transfer layer.

3. The method of claim 2, wherein dissolving the second transfer layer comprises dissolving the second transfer layer in water.

4. The method according to claim 3, wherein dissolving the second transfer layer comprises dissolving the second transfer layer at room temperature.

5. The method according to claim 1, wherein the target layer comprises an elastomer layer.

6. The method according to claim 5, wherein the elastomer layer has a Young's modulus equal to or less than 500 MPa at room temperature.

7. The method according to claim 5, wherein the target layer further comprises a conductive layer.

8. The method according to claim 7, wherein forming the target layer comprises forming the conductive layer and then forming the elastomer layer.

9. The method according to claim 7, wherein the conductive layer is a thin film metal layer.

10. The method according to claim 7, wherein the conductive layer is an inorganic layer.

11. The method according to claim 1, wherein the second substrate comprises a glass supporting substrate.

12. The method according to claim 1, wherein the second substrate comprises an elastomer layer.

13. The method of claim 12, wherein the elastomer layer comprises a channel configured for microfluidic flow.

14. The method according to claim 1, wherein the first substrate is transparent.

15. The method of claim 1, wherein the first transfer layer is an optically sensitive layer.

16. The method of claim 1, wherein separating the first transfer layer from the second transfer layer comprises separating the first transfer layer from the second transfer layer by exposure to a laser source.

17. The method of claim 1, wherein the second transfer layer comprises a polyvinyl alcohol.

18. The method of claim 1, wherein separating the first transfer layer from the second transfer layer comprises using heat to remove the first transfer layer.

19. A method comprising:
providing a first stack by:
forming a first transfer layer over a first substrate;
forming a second transfer layer on the first transfer layer, the second transfer layer being water-soluble; and
forming a target layer on the second transfer layer such that the target layer forms a first top surface of the first stack;
bonding the first top surface of the first stack to a second top surface of a second substrate stack that comprises a support structure, a patterned elastomer layer forming the second top surface, and a patterned thin film layer between the support structure and the patterned elastomer layer, wherein the patterned thin film layer comprises electronic circuitry configured for controlling a microfluidic device;
separating the first transfer layer from the second transfer layer; and
removing the second transfer layer from the target layer such that the target layer remains on the second substrate stack.

20. The method of claim 19, wherein the electronic circuitry is configured for controlling fluid flow through the target layer or through the patterned elastomer layer.

* * * * *